United States Patent [19]
Berg et al.

[11] Patent Number: 6,107,844
[45] Date of Patent: Aug. 22, 2000

[54] METHODS AND APPARATUS FOR REDUCING MOSFET BODY DIODE CONDUCTION IN A HALF-BRIDGE CONFIGURATION

[75] Inventors: Steven K. Berg; Cary L. Delano, both of San Jose, Calif.

[73] Assignee: Tripath Technology, Inc., Santa Clara, Calif.

[21] Appl. No.: 09/162,243

[22] Filed: Sep. 28, 1998

[51] Int. Cl.[7] .................................................. H03B 1/00
[52] U.S. Cl. ........................................... 327/110; 327/112
[58] Field of Search .................................. 327/108, 109, 327/110, 111, 112, 538, 543

[56] References Cited

U.S. PATENT DOCUMENTS

| | | | |
|---|---|---|---|
| 4,667,144 | 5/1987 | Jones et al. ............................ | 323/271 |
| 5,576,648 | 11/1996 | Rossi et al. ............................. | 327/110 |
| 5,598,119 | 1/1997 | Thayer et al. ........................... | 327/111 |
| 5,828,245 | 10/1998 | Brambilla et al. ...................... | 327/108 |
| 5,959,475 | 9/1999 | Zomorrodi ............................... | 327/112 |

*Primary Examiner*—Jeffrey Zweizig
*Attorney, Agent, or Firm*—Beyer Weaver & Thomas LLP

[57] ABSTRACT

Methods and apparatus for operating first and second switches arranged in a half-bridge configuration are described. First and second gate voltages on the first and second gates, respectively, of the first and second switches are controlled such that the first switch is on and the second switch is off. One of the first and second gate voltages is controlled such that the corresponding one of the first and second switches operates as a constant current source. After one of the first and second switches has been operating as a constant current source, the second gate voltage is controlled such that the second switch is on and the first gate voltage is controlled such that the first switch is off.

23 Claims, 7 Drawing Sheets

METHODS AND APPARATUS FOR REDUCING MOSFET BODY DIODE CONDUCTION IN A HALF-BRIDGE CONFIGURATION

BACKGROUND OF THE INVENTION

The present invention relates to power switching devices. More specifically, the present invention provides improved techniques for switching between high and low side devices in a half-bridge configuration.

Conventional integrated circuit half-bridge drivers typically use non-overlapping power MOSFET gate control signals to guarantee a minimum time interval when both high side and low side power MOSFETs are in a high impedance state. This interval is commonly referred to as the 'dead time'. The dead time interval occurs just prior to the commutation of current from one switching device to the other and is needed to ensure that there is no simultaneous conduction of current through the two switching devices, i.e., no shoot-through current. The dead time interval must often be larger than desired to insure that a minimum dead time is maintained over IC operational temperatures and process variations.

During the dead time, when both power switching devices are high impedance, any output current flowing in an inductive load is forced to flow through the parasitic body diode of either the high or low side switching device. When the half-bridge driver and power MOSFETs share the same silicon substrate, current flowing through the body diodes of the power MOSFETs can activate additional parasitic transistors on the IC substrate. Activation of these parasitic transistors can be an unwanted source of power dissipation and can interfere with the normal operation of the half-bridge control circuitry. Moreover, activation of these parasitic transistors can even destroy the IC via a well known mechanism known as latch-up.

A common solution to this problem is to add external Schottky diodes in parallel with the power MOSFET body diodes. The external Schottky diodes, having a lower forward voltage, then carry most of the current that would otherwise flow in the body diodes during the dead time. However, series inductance associated with the Schottky diodes and the half-bridge IC packaging often limits the effectiveness of this technique when switching large currents at high frequencies. This solution also adds considerable cost to a system and is thus undesirable.

FIG. 1 of the drawings illustrates the prior art half-bridge switching power amplifier. V1 and V2 are typically 5V to 10V voltage sources. The gates of power MOSFETs M1 and M2 are driven such that there is a time interval when both M1 and M2 are off and not conducting current. This time interval has been referred to herein as the dead time. During the dead time, when current is flowing into or out of the switching power amplifier output due to an inductive load, one of the body diodes D1 or D2 conducts the current. This causes the output to rise above VDD or fall below GND by an amount determined by the forward voltage of the body diode.

The gate drive, output voltage and output current waveforms for the switching power amplifier of FIG. 1 are shown in FIG. 2. FIGS. 3 and 4 are simplified illustrations of the two-step switching process for the half-bridge power amplifier in FIG. 1 according to the prior art. The gate switches from FIG. 1 have been removed for simplicity and the power MOSFETs are represented by their respective region-of-operation resistance. FIG. 3 shows the case where current is flowing into the amplifier output stage and FIG. 4 shows the case where current is flowing out of the amplifier output stage.

FIGS. 3a through 3c show the three states of the switching process for the half-bridge power amplifier in FIG. 1 for the case where current is flowing into the amplifier output stage, i.e., interval t0–t5 in FIG. 2. In FIG. 3a, load current is flowing into M2 with M2 acting as a switch conducting the current to GND (State 1). The first step of the conventional switching process is to discharge the gate of M2 completely. This causes both output MOSFETs to be in a high impedance state as shown in FIG. 3b (State 2). During this dead time (interval t1–t2 of FIG. 2), the output current remains relatively constant and therefore flows almost entirely through D1 back into the power supply VDD. As can be seen in FIG. 2, the voltage drop across D1 causes the output voltage Vout to rise above VDD during this interval. The second step of the switching process is to charge the gate of M1 which then diverts the current from D1 as shown in FIG. 3c (State 3). The sequence 3a-3b-3c illustrates the output voltage transitioning from low to high. The process is reversible for the case when the output voltage is transitioning from high to low, i.e., 3c-3b-3a.

FIGS. 4a through 4c show the three states of the switching process for the half-bridge power amplifier in FIG. 1 for the case where current is flowing out of the amplifier output stage, i.e., interval t5–t9 in FIG. 2.

Body diode conduction of IC power devices during conventional switching can have catastrophic consequences for the IC. It is therefore desirable to provide techniques by which switching of a half-bridge configuration may be accomplished while minimizing the current conducted by the body diodes of the power devices.

SUMMARY OF THE INVENTION

According to the present invention, control circuitry has been incorporated into a half-bridge gate driver to minimize body diode conduction and shoot-through currents of the half-bridge power MOSFETs. The control circuitry of the present invention achieves this by operating one of the two power MOSFETs of the half-bridge as a current source, i.e., in the saturation region rather than the linear region, during current commutation.

The MOSFET operating as a current source diverts and conducts current that normally flows in one of the two power MOSFET body diodes during the dead time interval. Thus, while one power MOSFET provides the required output load current, the other power MOSFET, acting as a switch, can either be turned on to switch the output to the desired voltage or it can be turned off.

In the case where the switch MOSFET is turned on to switch the output, the current source MOSFET is turned off once the output has switched. For the case where the switch MOSFET is turned off, the current source MOSFET is then fully enhanced, which switches the output to the desired voltage.

In order to operate the power MOSFETs as current sources, the gate drive circuit must be able to partially charge and discharge the power MOSFET gates. The voltage to which the gate must be charged is determined by the output current. According to a specific embodiment, the current source magnitude is substantially equal to the output current magnitude thereby avoiding cross-conduction between the two power MOSFETs.

Thus, the present invention provides methods and apparatus for operating first and second switches arranged in a half-bridge configuration. First and second gate voltages on the first and second gates, respectively, of the first and second switches are controlled such that the first switch is on and the second switch is off. One of the first and second gate voltages is controlled such that the corresponding one of the first and second switches operates as a constant current source. After one of the first and second switches has been operating as a constant current source, the second gate voltage is controlled such that the second switch is on and the first gate voltage is controlled such that the first switch is off.

According to a specific embodiment, the first and second gate voltages are controlled such that the first switch is on and the second switch is off. The first gate voltage is then controlled such that the first switch operates as a constant current source. While the first switch is operating as a constant current source, the second gate voltage is controlled such that the second switch is on. After the second switch is turned on, the first gate voltage is controlled such that the first switch is off.

According to another specific embodiment, the first and second gate voltages are controlled such that the first switch is on and the second switch is off. The second gate voltage is then controlled such that the second switch operates as a constant current source. While the second switch is operating as a constant current source, the first gate voltage is controlled such that the first switch is turned off. After the first switch is turned off, the second gate voltage is controlled such that the second switch is on.

A further understanding of the nature and advantages of the present invention may be realized by reference to the remaining portions of the specification and the drawings.

DESCRIPTION OF SPECIFIC EMBODIMENTS

Figure 1:
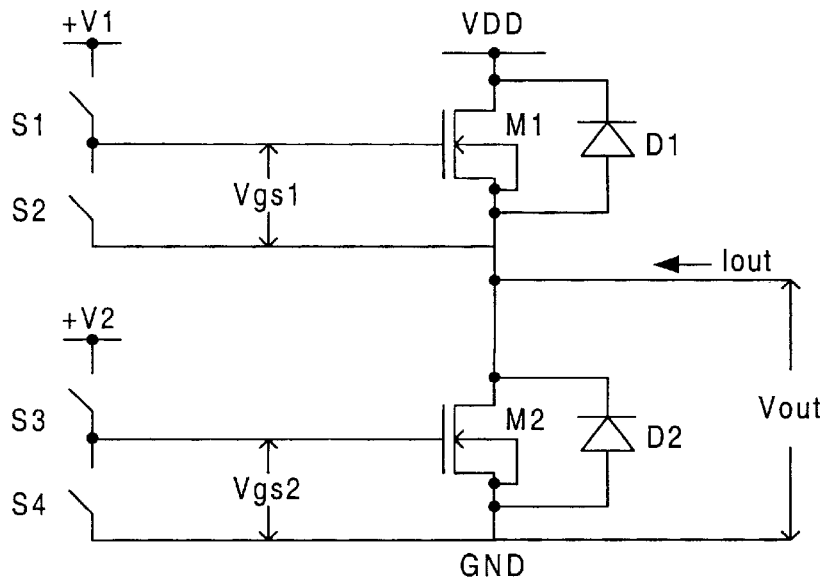
FIG. 1 is a circuit diagram of a conventional half-bridge switching power amplifier. Switches S1 through S4 control the gate charging and discharging of power MOSFETs M1 and M2. Diodes D1 and D2 are the parasitic body diodes associated with the power MOSFETs.
Figure 2:
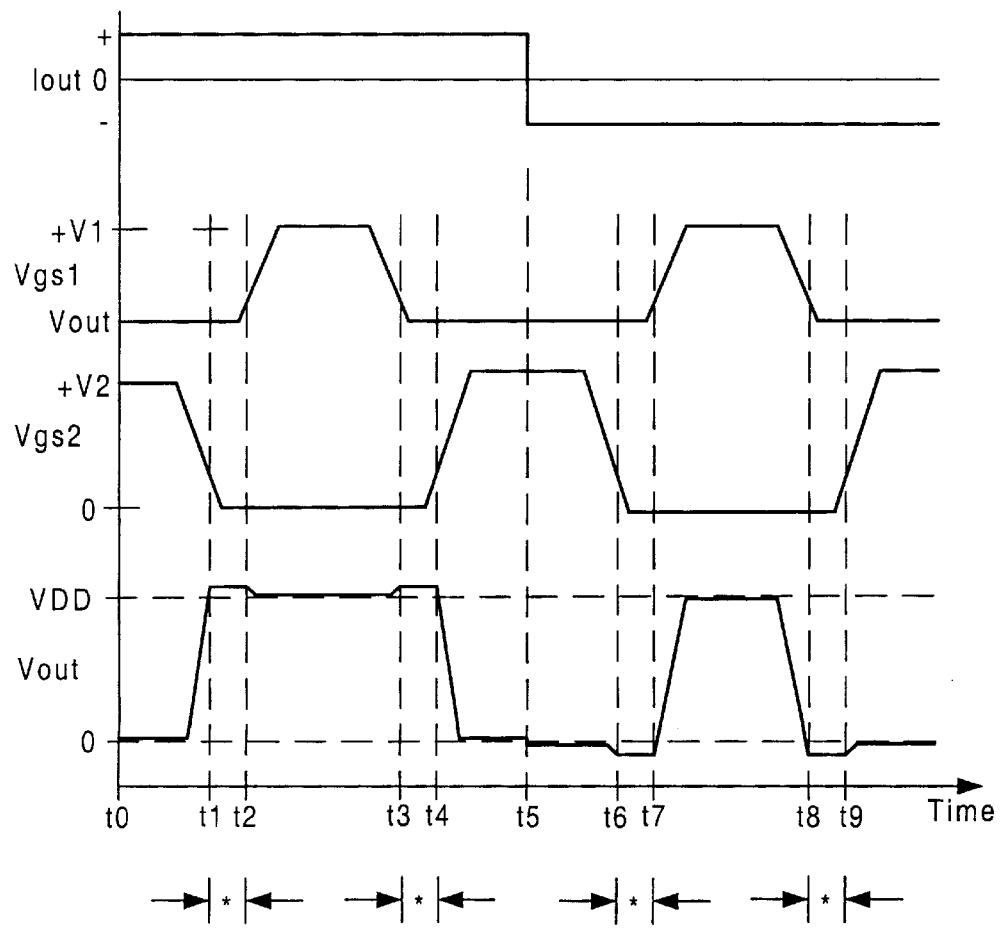
FIG. 2 is a switch timing diagram illustrating the gate control waveforms for the power MOSFETs in FIG. 1. Also shown is the output voltage and current waveforms for both positive and negative output current directions.
Figure 5:
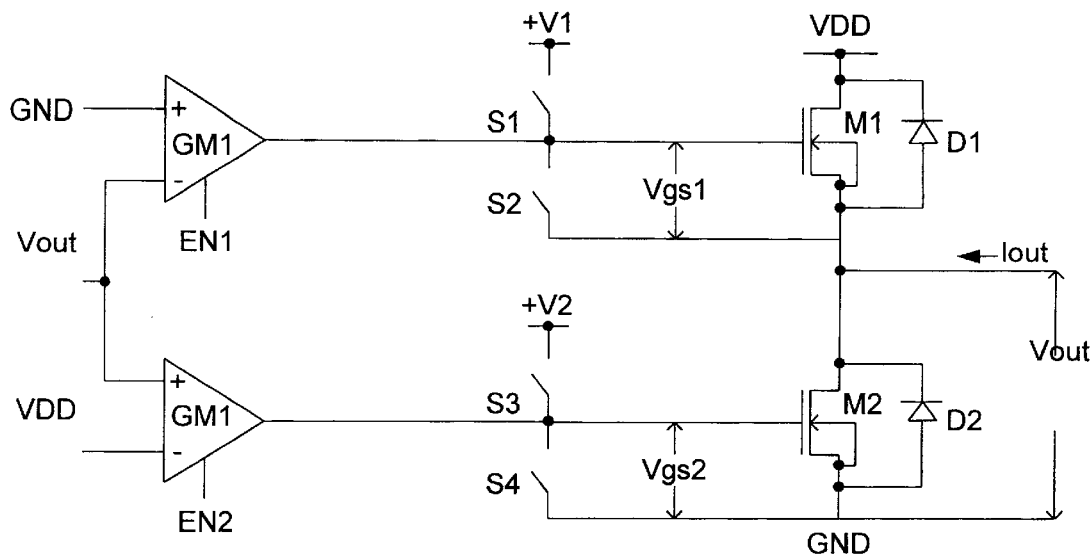
FIG. 5 is a simplified circuit diagram illustrating one implementation of the additional gate control circuitry of the present invention. Switches S1 through S4 and transconductance stages GM1 and GM2 control the gate charging and discharging of power MOSFETs M1 and M2. Diodes D1 and D2 are the parasitic body diodes associated with the power MOSFETs.
Figure 6:
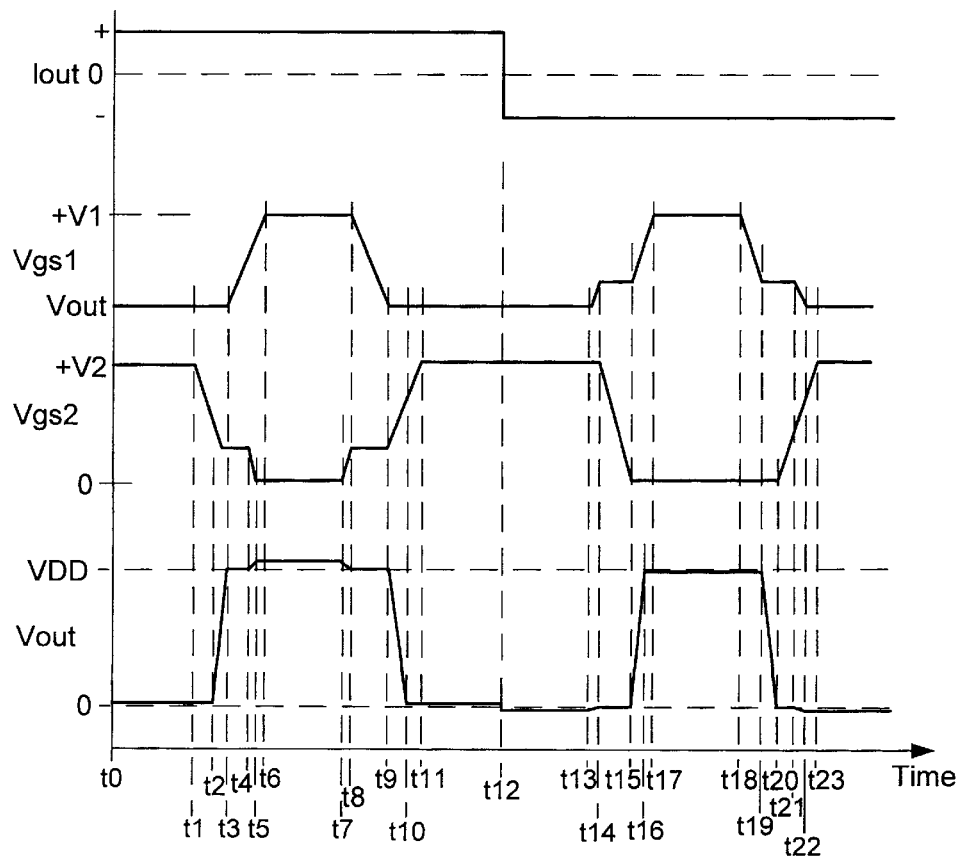
FIG. 6 is a switch timing diagram illustrating the manner in which the gates of the power MOSFETs in FIG. 5 are controlled in accordance with the new invention. Also shown is the output voltage and current waveforms for both positive and negative output current directions.
Figure 7:
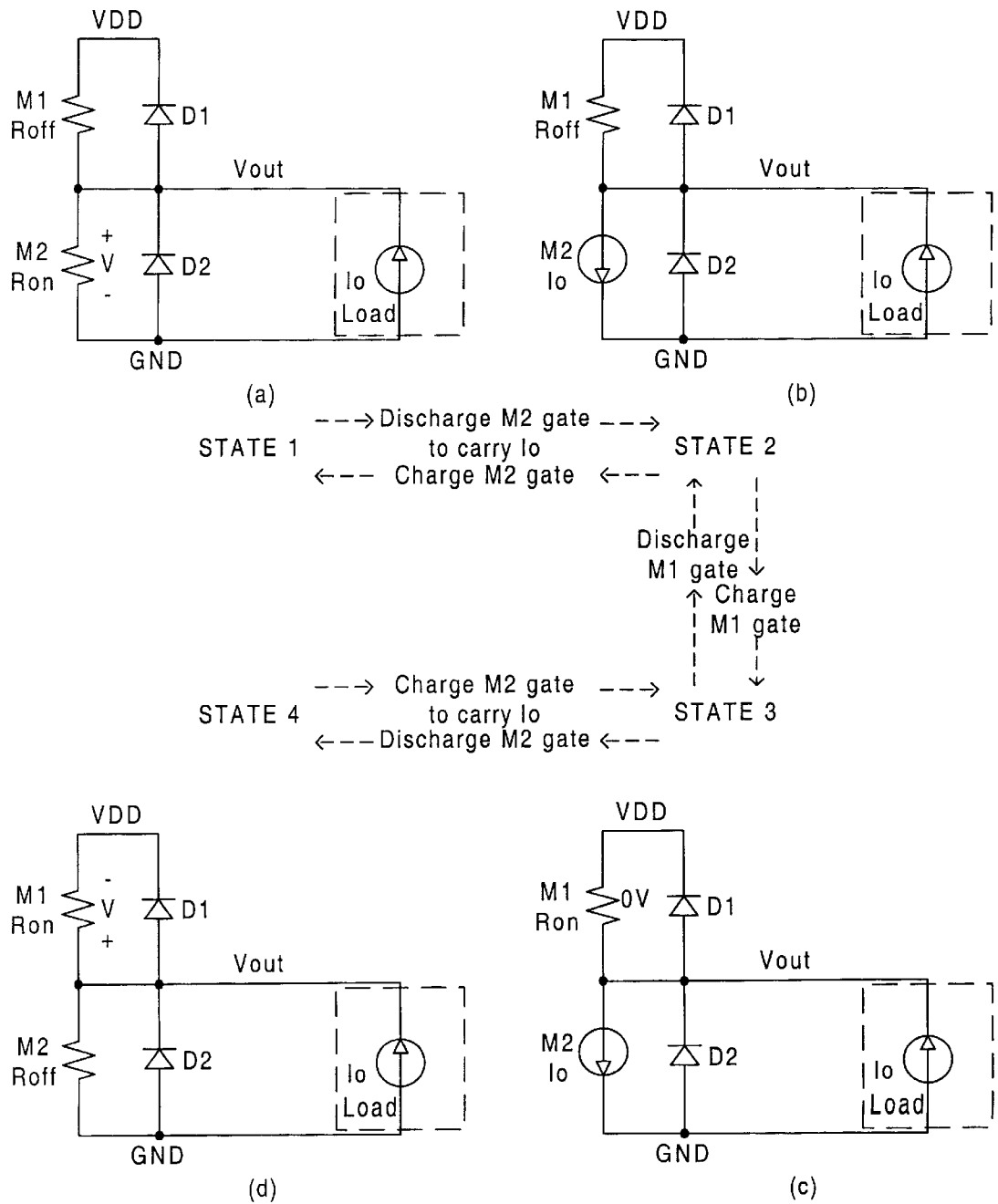
FIGS. 7a through 7d show the general case of the four state switching process for the present invention half-bridge power amplifier for the case where current is flowing into the amplifier output stage. The gate switches and transconductance stages from FIG. 5 have been removed for simplicity and the power MOSFETs are represented by their respective region-of-operation resistance.
Figure 8:
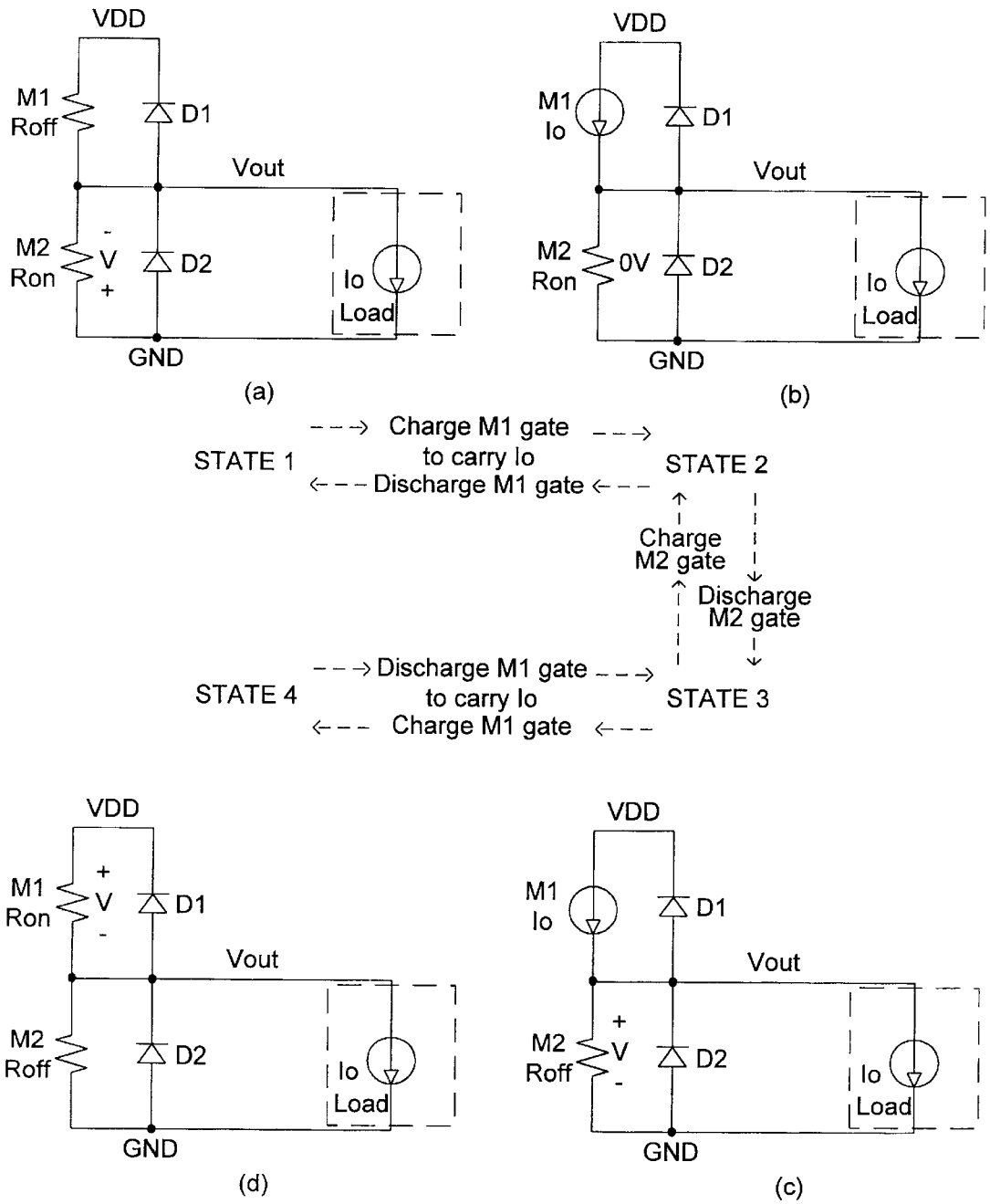
FIGS. 8a through 8d show the general case of the four state switching process for the present invention half-bridge power amplifier for the case where current is flowing out of the amplifier output stage. The gate switches and transconductance stages from FIG. 5 have been removed for simplicity and the power MOSFETs are represented by their respective region-of-operation resistance.

As will now be discussed with reference to FIGS. 5–9, additional gate control circuitry has been added to the basic switching power amplifier configuration of FIG. 1 to control the body diode dead time conduction currents. Two transconductance stages GM1 and GM2, when enabled by signals EN1 and EN2, sense the voltage across one of the MOSFET in order to set the gate voltage of the other MOSFET. When disabled, the outputs of GM1 and GM2 are high impedance. GM1 and GM2 allow the MOSFETs to be operated as current sources rather than just as switches. Switches S1–S4 allow for quick gate charging and discharging of M1 and M2. The gate drive, output voltage and output current waveforms for the switching power amplifier of FIG. 5 are shown in FIG. 6. The three-step switching process of the present invention is illustrated in FIGS. 7 and 8 where the gate switches and transconductance stages from FIG. 5 have been removed for simplicity and the power MOSFETs are represented by their respective region-of-operation resistance. FIG. 7 shows the case where current is flowing into the amplifier output stage and FIG. 8 shows the case where current is flowing out of the amplifier output stage.

Figure 3:
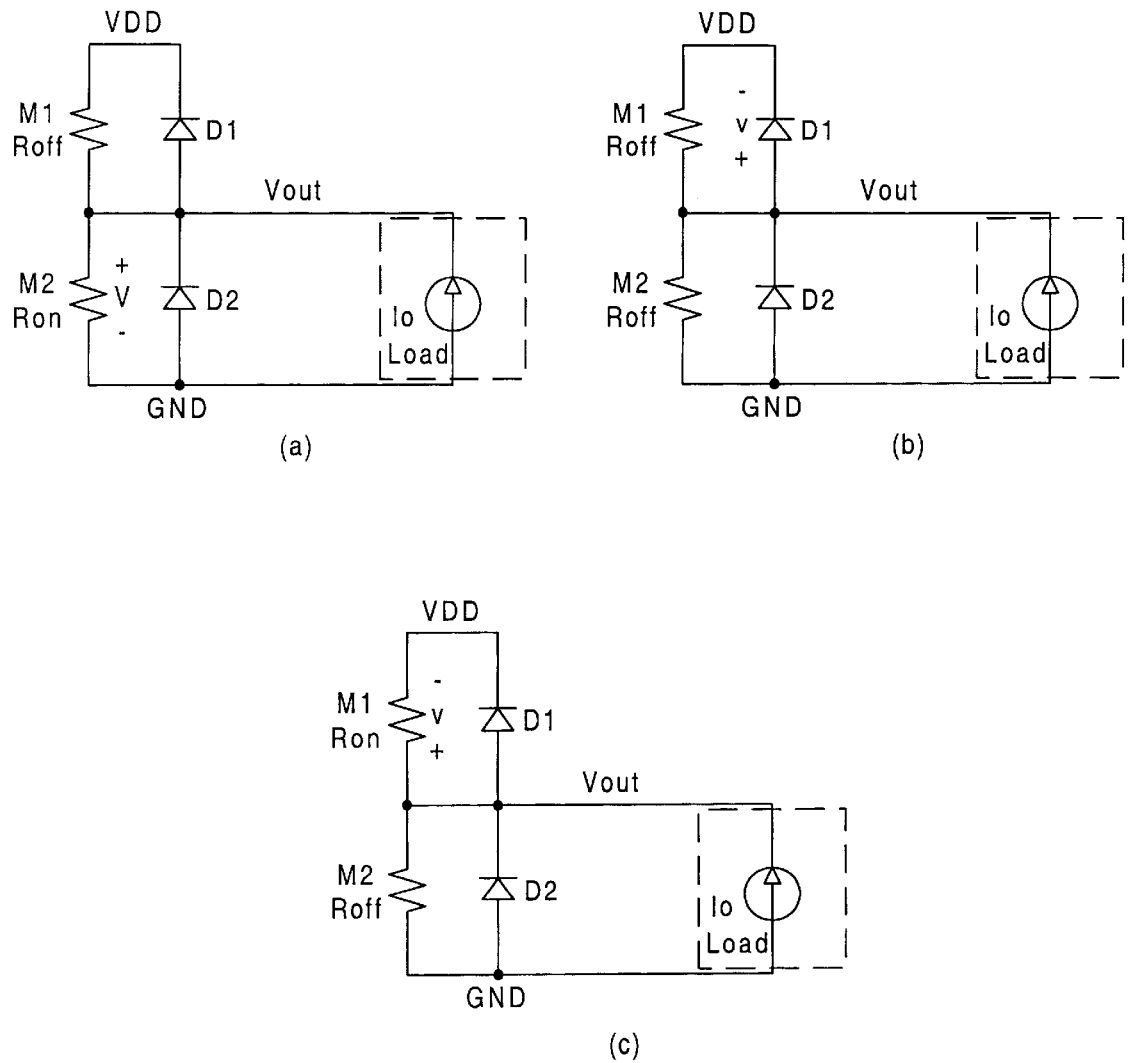
FIGS. 3a through 3c show the three states of the switching process for the prior art half-bridge power amplifier in FIG. 1 for the case where current is flowing into the amplifier output stage. The gate switches from FIG. 1 have been removed for simplicity and the power MOSFETs are represented by their respective region-of-operation resistance.
Figure 4:
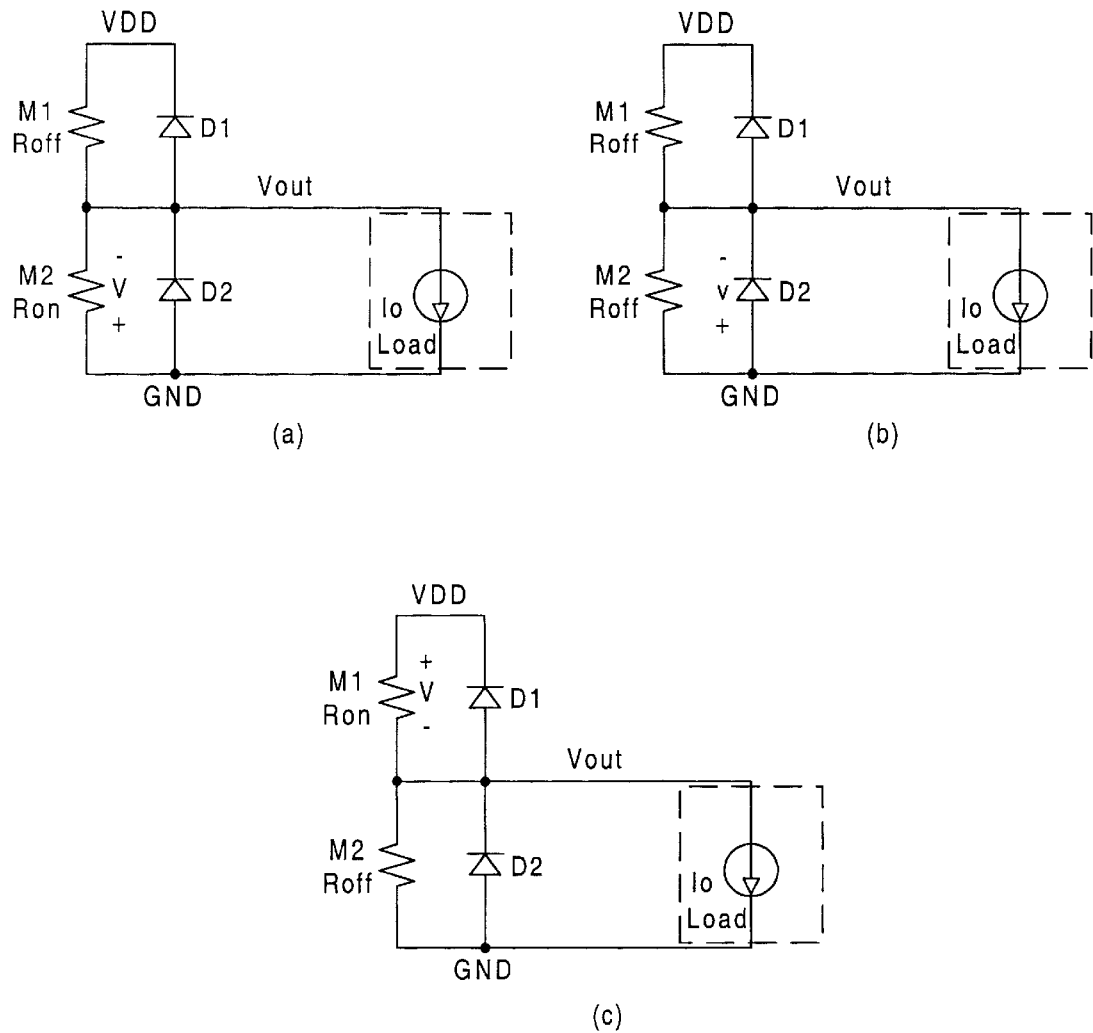
FIGS. 4a through 4c show the three states of the switching process for the prior art half-bridge power amplifier in FIG. 1 for the case where current is flowing out of the amplifier output stage. The gate switches from FIG. 1 have been removed for simplicity and the power MOSFETs are represented by their respective region-of-operation resistance.

According to a specific embodiment of the present invention, the dead time switch states of FIGS. 3b and 4b are each replaced by the two states shown in FIGS. 7b and 7c and FIGS. 8b and 8c, respectively. In this embodiment, one of the MOSFETs acting as a current source diverts the load current that would otherwise flow through the body diode of the other MOSFET during the dead time interval. FIG. 7a illustrates one of the possible initial states of the half bridge power amplifier where load current is flowing into the amplifier output with M2 acting as a switch conducting the current to GND (State 1). The gate-source voltage of M2 is then reduced such that M2 operates as a current source of magnitude equal to that of the output current, Io, as shown in FIG. 7b (State 2). The gate of M1 is then fully charged to clamp the output to VDD as shown in FIG. 7c (State 3). Finally, the gate of M2 is completely discharged placing it into a high impedance state as indicated by Roff in FIG. 7d (State 4). Note that current did not flow through the body diodes D1 or D2 at any time during this switching process.

The switching process described by the sequence 7a-7b-7c-7d is completely reversible. When the initial state of the half-bridge output is State 4 as shown in FIG. 7d, the reverse steps can be taken to restore the half bridge to State 1, i.e., 7d-7c-7b-7a.

The output current direction must be sensed prior to beginning the switching sequence to determine which device, high side or low side, will act as the current source. For example, in FIG. 7a, load current is flowing into the output which will be transitioning from low to high. Under this condition M2 becomes the current source. By contrast, in FIG. 8a, where the load current is flowing out of the output that will be transitioning from low to high, M1 becomes the current source. The output current direction can be determined, for example, by measuring the polarity of the voltage across the conducting MOSFET just prior to the output switching.

In order to minimize the switching process time, the conduction states of the output power MOSFETs is determined prior to the next state change. For example, in FIG. 7c, the conduction state of M1 is determined before the decision is made to turn off the current source as in FIG. 7d. According to a specific embodiment, the gate-source voltage of the MOSFET in question is used to make this determination.

To further illustrate the operation of the present invention, the switching conditions illustrated in FIGS. 7 and 8 will now be applied to a specific embodiment of the invention as shown in FIG. 5 with waveform timing shown in FIG. 6.

Consider first the condition where current Iout is flowing into M2 of FIG. 5, and the output will be transitioning from low to high as shown in FIG. 6 (time interval t1–t6). M2 is initially in the linear region of operation and conducting the current to GND. This forms a small positive voltage across the Rdson of M2. This condition is equivalent to State 1 shown in FIG. 7a and corresponds to the time interval t0–t1 in FIG. 6. To switch the output from GND to VDD, GM2 is enabled which begins discharging the gate of M2 (time interval t1–t2). As Vout rises (time interval t2–t3), M2 leaves the linear region of operation. The Miller capacitance associated with M2 diverts any gate discharge current that GM2 provides during this interval and thus Vgs2 is held (interval t2–t3). Once Vout reaches VDD, GM2 maintains Vgs2 at the desired level to keep D1 from turning on (interval t3–t4). M1 is then turned on by S1. However, no current flows in M1 since there is 0V across it (interval t3–t4). Once M1 is fully enhanced, GM2 is disabled and S4 activated to turn current source M2 off (interval t4 t5). Iout then flows completely through M1 (interval t5–t7).

Now, consider the condition where current Iout is flowing into M1 and the output will be transitioning from high to low as shown in FIG. 6 (time interval t7–t11). M1 is initially in the linear region of operation and conducting Iout to VDD. This forms a small positive voltage (with respect to VDD) across the Rdson of M1. This condition is equivalent to State 4 shown in FIG. 7d and corresponds to the time interval t5–t7 in FIG. 6. To switch the output from VDD to GND, GM2 is enabled which charges Vgs2 to the desired voltage to set the drain current of M2 equal to Iout. M1 is still on and has the output voltage clamped at VDD (interval t7–t8). The gate of M1 is then discharged via S2 (interval t8–t9). Once Vgs1 is fully discharged, GM2 is disabled and S3 is activated to fully charge M2's gate (interval t9–t11). The output then transitions from high to low.

Next, consider the condition where current Iout is flowing out of M2 and the output will be transitioning from low to high as shown in FIG. 6 (time interval t13–t17). M2 is initially in the linear region of operation and sourcing Iout from GND. This forms a small negative voltage across the Rdson of M2. This condition is equivalent to State 1 shown in FIG. 8a and corresponds to the time interval t12–t14 in FIG. 6. To divert Iout from M2, GM1 is enabled which then charges Vgs1 to the desired voltage to set the source current of M1 equal to Iout and bring the voltage across M2 to zero (interval t13–t14). Vgs2 is then discharged via S4 once current source M1 is properly set (interval t14–t15). Once the gate of M2 is completely discharged, GM1 is disabled and S1 is activated to fully charge the gate of M1 (interval t15–t17) resulting in the output rising to VDD.

Finally, consider the condition where current Iout is flowing out of M1 and the output transitions from high to low as shown in FIG. 6, time interval t18–t23. M1 is initially in the linear region of operation and sourcing Iout from VDD. This forms a small negative voltage (with respect to VDD) across the Rdson of M1. This condition is equivalent to State 4 shown in FIG. 8d and corresponds to the time interval t16–t19 in FIG. 6. To switch the output from VDD to GND, GM1 is enabled which discharges Vgs1 to the desired voltage to set the source current of M1 equal to Iout (interval t18–t19). As VGS1 drops below the level needed to maintain output current, the load current pulls Vout low (interval t19–t20). GM1 then holds Vgs1 at the proper voltage to maintain Iout (interval t19–t21). M2 may then be fully enhanced since there is 0V across M2 (interval t20–23). Once M2 is on sufficiently, M1 is turned off and the output current flows entirely through M2 (interval t21–t22).

Figure 9:
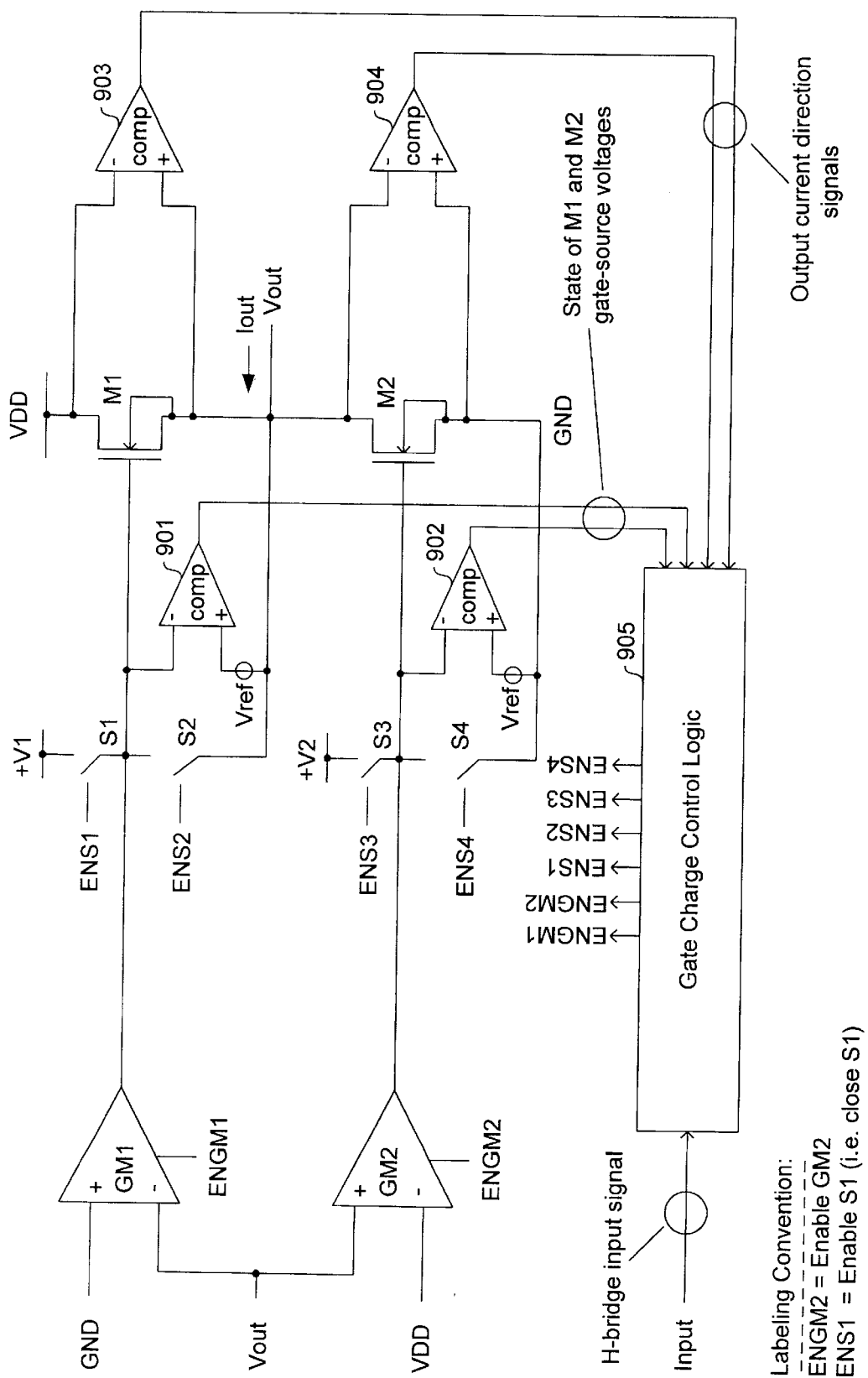
FIG. 9 shows a circuit diagram of a more specific embodiment of the present invention.

FIG. 9 shows a circuit diagram of a more specific embodiment of the invention. The circuit depicted may be manufactured according to any of a variety of semiconductor processes such as, for example, bipolar, CMOS, DMOS, IGBT, etc. Moreover, it will be understood that different combinations of these processes may be employed to form the depicted circuit. Comparators 901 and 902 monitor the gate-source voltage of M1 and M2 so that the conduction states of the M1 and M2 can be known. Comparators 903 and 904 monitor the voltage across each FET, M1 and M2, so that the direction of the output current can be determined. Both conduction state and output current direction information are fed into the Gate Charge Control Logic block 905. The logic within this block determines the state of the elements that charge and discharge the gates of M1 and M2, i.e., S1, S2, S3, S4, GM1 and GM2, in accordance with the previously described switching procedures. It will be understood that control logic block 905 may be implemented in a wide variety of ways without departing from the scope of the present invention. It will also be understood that because the implementation of control logic block 905 is well within the abilities of the typical logic designer, a description of a specific implementation has not been included herein to avoid unnecessary obfuscation of the principles of the invention.

An example of the operation of the present invention will now be described with reference to FIG. 9. In this example, current is flowing into the output of the switching amplifier and M1 is conducting the current to VDD. The output voltage (Vout) is slightly above VDD (Vout=(Iout×Rdson)+VDD). The H-bridge input signal goes low indicating that M1 should be turned off and that M2 should be turned on. Gate Charge Control Logic 905 does several things in an ordered sequence to prevent body diode conduction. It senses the direction of the output current via comparator 903. It enables S2 thus initiating discharge of M1's gate. It enables GM2 thus initiating a partial charging of M2's gate. M2's gate will be charged until the output drops to VDD, and then held. At the time when Vout is equal to VDD, M2, acting as a current source, conducts all of the output current and M1 is merely clamping Vout to VDD. Once comparator 901 detects that the gate-source voltage of M1 has fallen below a predetermined reference voltage (Vref), indicating that M1 is no longer capable of conducting significant current, Gate Charge Control Logic 905 disables GM2 and enables S3. S3 allows the gate of M2 to be fully charged to V2 and the output falls to a voltage slightly above 0V (Vout=Iout×Rdson) as M2 becomes fully enhanced, thus completing the switching operation. This example illustrates the control sequence for the case where current is flowing into the output and the output voltage transitions from high to low. Gate Charge Control Logic 905 provides similar sequencing for the other three cases which include current flowing into the output and Vout transitioning from low to high, current flowing out of the output and Vout transitioning from low to high, and current flowing out of the output and Vout transitioning from high to low.

While the invention has been particularly shown and described with reference to specific embodiments thereof, it will be understood by those skilled in the art that changes in the form and details of the disclosed embodiments may be made without departing from the spirit or scope of the invention. For example, in the embodiments described herein, power MOSFETs are used as the switching and current source devices. However, it will be understood that a variety of other types of power switching devices could be used. These include any type of device that can be configured as both a current source and a switch, e.g., IGBTs, bipolar transistors, PMOS devices, etc. Moreover, according to some embodiments, voltage outputs could be used in place of the transconductance stages. In addition, the transconductance stages could have their inputs switched to allow these stages to perform the functions of S1–S4, thus eliminating the need for S1–S4. Therefore, the scope of the invention should be determined with reference to the appended claims.

What is claimed is:

1. A method for operating first and second switches arranged in a half-bridge configuration, the first and second switches having first and second gates, respectively, comprising:

controlling first and second gate voltages on the first and second gates, respectively, such that the first switch is on and the second switch is off;

controlling one of the first and second gate voltages such that the corresponding one of the first and second switches operates as a constant current source;

after the one of the first and second switches has been operating as a constant current source, controlling the second gate voltage such that the second switch is on; and controlling the first gate voltage such that the first switch is off.

2. The method of claim 1 wherein the first switch is operated as the constant current source.

3. The method of claim 1 wherein the second switch is operated as the constant current source.

4. The method of claim 1 wherein the first switch is a high-side switch and the second switch is a low-side switch, and wherein an output current having a direction is associated with the half-bridge configuration, the method further comprising:

sensing the direction of the output current;

where the output current is directed into the half-bridge configuration, operating the second switch as the constant current source; and where the output current is directed out of the half-bridge configuration, operating the first switch as the constant current source.

5. The method of claim 1 wherein the first switch is a low-side switch and the second switch is a high-side switch, and wherein an output current having a direction is associated with the half-bridge configuration, the method further comprising:

sensing the direction of the output current;

where the output current is directed into the half-bridge configuration, operating the first switch as the constant current source; and where the output current is directed out of the half-bridge configuration, operating the second switch as the constant current source.

6. The method of claim 1 further comprising sensing an output voltage associated with the half-bridge configuration, the first and second gate voltages being controlled in accordance with the output voltage.

7. The method of claim 6 wherein the output voltage comprises a first voltage across the first switch.

8. The method of claim 6 wherein the output voltage comprises a first voltage across the second switch.

9. The method of claim 6 wherein the output voltage comprises a half-bridge configuration output voltage.

10. The method of claim 1 wherein the constant current source has a first magnitude associated therewith, and wherein an output current of a second magnitude is associated with the half-bridge configuration, the first and second magnitudes being substantially the same.

11. A method for operating first and second switches arranged in a half-bridge configuration, the first and second switches having first and second gates, respectively, comprising:

controlling first and second gate voltages on the first and second gates, respectively, such that the first switch is on and the second switch is off;

controlling the first gate voltage such that the first switch operates as a constant current source;

while the first switch is operating as a constant current source, controlling the second gate voltage such that the second switch is on; and after the second switch is turned on, controlling the first gate voltage such that the first switch is off.

12. A method for operating first and second switches arranged in a half-bridge configuration, the first and second switches having first and second gates, respectively, comprising:

controlling first and second gate voltages on the first and second gates, respectively, such that the first switch is on and the second switch is off;

controlling the second gate voltage such that the second switch operates as a constant current source;

while the second switch is operating as a constant current source, controlling the first gate voltage such that the first switch is turned off; and after the first switch is turned off, controlling the second gate voltage such that the second switch is on.

13. A switching circuit comprising:

first and second switches arranged in a half-bridge configuration, the first and second switches having first and second gate terminals, respectively, the half-bridge configuration having an output terminal; and gate control circuitry coupled to the output terminal and the first and second gate terminals which is operable to control the first and second switches to alternately operate as constant current sources to facilitate current commutation between the first and second switches.

14. The switching circuit of claim 13 wherein the gate control circuitry comprises third and fourth switches coupled to the first gate terminal for enabling and disabling the first switch, a first amplifier coupled to the first gate terminal for controlling the first switch to operate as a constant current source, fifth and sixth switches coupled to the second gate terminal for enabling and disabling the second switch, a second amplifier coupled to the second gate terminal for controlling the second switch to operate as a constant current source, and control logic for selectively enabling the third, fourth, fifth and sixth switches and the first and second amplifiers.

15. The switching circuit of claim 14 wherein the control circuitry further comprises output sensing circuitry coupled to the first and second switches for indicating a direction of an output current associated with the half-bridge configuration to the control logic.

16. The switching circuit of claim 14 further comprising gate sensing circuitry coupled to the first and second gate terminals for indicating the state thereof to the control logic.

17. An integrated circuit comprising:
first and second transistors arranged in a half-bridge configuration, the first and second transistors having first and second gate terminals, respectively, the half-bridge configuration having an output node;
gate control circuitry coupled to the output node and the first and second gate terminals which is operable to control the first and second transistors to alternately operate as constant current sources to facilitate current commutation between the first and second transistors.

18. The integrated circuit of claim 17 wherein the first and second transistors comprises MOSFETs.

19. The integrated circuit of claim 17 wherein the first and second transistors and the gate control circuitry are formed using CMOS technology.

20. The integrated circuit of claim 17 wherein the first and second transistors and the gate control circuitry are formed using DMOS technology.

21. The integrated circuit of claim 17 wherein the first and second transistors and the gate control circuitry are formed using bipolar technology.

22. The integrated circuit of claim 17 wherein the first and second transistors and the gate control circuitry are formed using IGBT technology.

23. The integrated circuit of claim 17 wherein the first and second transistors and the gate control circuitry are formed using a combination of technologies selected from the group of CMOS, DMOS bipolar, and IGBT.

* * * * *